United States Patent [19]
Broome

[11] Patent Number: 5,952,877
[45] Date of Patent: Sep. 14, 1999

[54] INTEGRATED RESISTOR FOR CONTINUOUS TIME SIGNAL PROCESSING APPLICATIONS

[75] Inventor: Steven Martin Broome, Apex, N.C.

[73] Assignee: International Business Machines Corporation, Armonk, N.Y.

[21] Appl. No.: 08/976,330

[22] Filed: Nov. 21, 1997

[51] Int. Cl.⁶ ...................................................... H03K 5/00
[52] U.S. Cl. ........................................... 327/551; 327/427
[58] Field of Search ..................................... 327/389, 427, 327/434, 437, 551, 552, 553, 554, 558, 566, 581; 330/9; 341/143

[56] References Cited

U.S. PATENT DOCUMENTS

| | | | |
|---|---|---|---|
| 3,588,531 | 6/1971 | Bjor ........................................... | 327/554 |
| 4,035,628 | 7/1977 | Lampe et al. ............................. | 235/193 |
| 4,114,117 | 9/1978 | Ford ................................... | 333/70 CR |
| 5,006,733 | 4/1991 | Brown ...................................... | 327/553 |
| 5,124,593 | 6/1992 | Michel ...................................... | 327/554 |
| 5,317,217 | 5/1994 | Rieger et al. ........................... | 327/555 |
| 5,434,535 | 7/1995 | Tomasini et al. ........................ | 327/552 |
| 5,446,406 | 8/1995 | Gantioler et al. ........................ | 327/427 |
| 5,508,570 | 4/1996 | Laber et al. ............................. | 327/563 |
| 5,519,349 | 5/1996 | Nakahara ................................. | 327/237 |

OTHER PUBLICATIONS

"Precise Electrically Programmed Resistor", IBM Technical Disclosure Bulletin, vol. 31, No. 2., July. 1988.

*Primary Examiner*—My-trang Nu Ton
*Attorney, Agent, or Firm*—John D. Flynn; Morgan & Finnegan

[57] ABSTRACT

A circuit and method provide a high valued resistance that is ideally used in low bandwidth filter and other signal processing applications. In one embodiment, an active device circuit includes first and second transistors, each having a gate, a source and a drain. The source voltages of the transistors change in response to an input signal voltage on an input terminal, and a current source constrains the gate to source voltages across the first and second transistors thus producing an output signal at an output terminal connected to the gate of the second transistor having a desired output resistance value based on the resistance across the drain and source terminals of the second transistor.

20 Claims, 8 Drawing Sheets

INTEGRATED RESISTOR FOR CONTINUOUS TIME SIGNAL PROCESSING APPLICATIONS

FIELD OF THE INVENTION

The present invention relates to semiconductor devices. More particularly, the present invention relates to the use of transistors for creating a high valued resistor on an integrated circuit for use in a low bandpass filter and other analog signal processing applications.

BACKGROUND OF THE INVENTION

To contain cost and reduce complexity, it is a goal of analog circuit design to implement analog functions that have traditionally been performed by discrete components on integrated circuit chips. An analog signal proesssing function found in many analog systems is a low-pass filter. Low-pass filters receive an input signal having a range of frequency components, filter out high frequencies components from the signal, and allow only low frequency components of the input signal to propagate.

Figure 1:
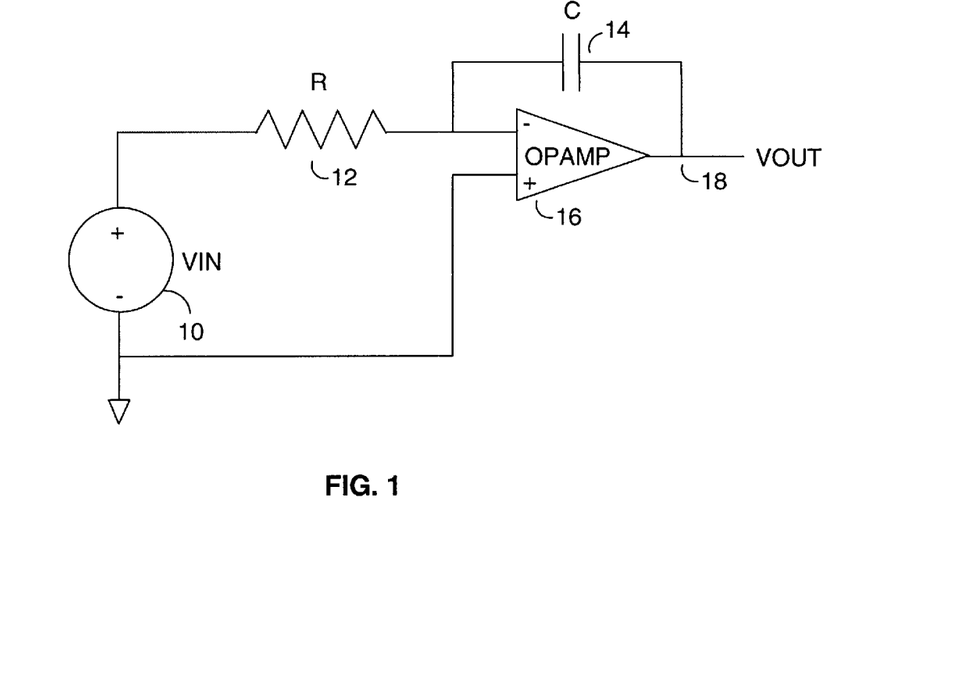
FIG. 1 depicts an integrating, continuous time filter of the prior art.
Figure 2:
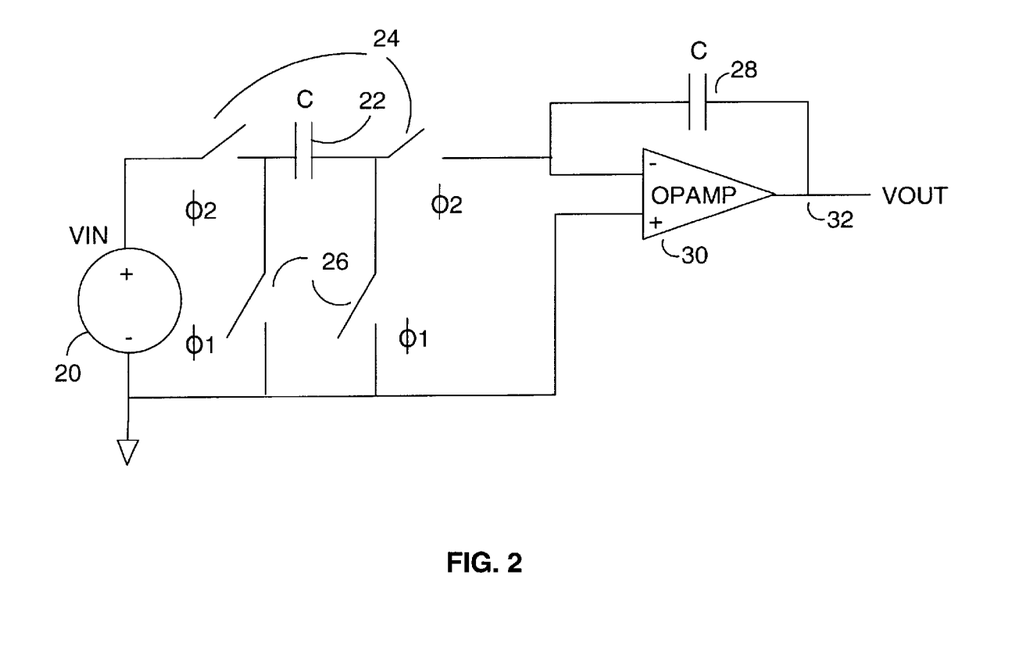
FIG. 2 depicts a switched capacitor filter of the prior art.

Two examples are of low-pass filter implementations of the prior art are shown in FIGS. 1 and 2. FIG. 1 illustrates a continuous time, low-pass filter implemented in an integrator configuration. An input signal enters the filter at Vin, is integrated by a resistor, capacitor, and operational amplifier, and an integrated output signal exits at Vout. Values are chosen for R and C in FIG. 1 to set a low frequency pole ($f_0$) which determines the frequency response of the low-pass filter using the following equation:

$$f_0 = \frac{1}{2\pi RC} \text{Hz}$$

Attempts have been made to implement the circuit of FIG. 1 on an integrated circuit ("IC") chip. Implementation is a problem, however, because a resistance (R) of about 10 KΩ is the maximum value practically achievable using passive resistors on an IC chip. This maximum is not absolute, but is dictated by the processing techniques used and the chip area required to make a resistor. Because 10 KΩ is a relatively small value, in order to set a low frequency pole at an ideal range for low pass filtering of between 1 and 10 Khz, the value of capacitor must be between approximately 1.5 and 15 nF. These values of capacitance are much too large to be practically implemented on an IC chip. Therefore, off-chip capacitors must be used to produce the necessary capacitance for C in FIG. 1, resulting in a forfeiture of at least two input/output ("I/O") pins on the IC chip which must be connected to the terminals of the capacitor. In addition, the I/O pins and off-chip wiring required to connect an external capacitor to the filter circuit of FIG. 1 act as antennas that couple a substantial quantity of high-frequency card or module noise back into the filter circuit thus reducing the effectiveness of the filter circuit.

FIG. 2 shows a switched capacitor implementation of a low-pass filter. In this configuration, a continuous time resistor is simulated by the clocked switches surrounding the capacitor C1. The clock phases $\Phi_1$ and $\Phi_2$ are generated at a specified frequency and are typically non-overlapping. The frequency of the clock and the values of C 1 and C2 are selected for a desired low frequency pole determined by the following equation where T is the period of the clock:

$$f_0 = \frac{C_1}{TC_2}$$

The switched capacitor technique has a number of disadvantages when implemented on an integrated circuit. First, the clocks are generated external to the chip and must be brought onto the chip. Therefore, additional I/O pins are required. Also, the clock signal lines themselves couple high-frequency noise from the card or module into the filter circuitry thus reducing the effectiveness of the low-pass filter. Second, in order for the switched circuit capacitor circuit to function properly, the frequency of the clock signals must be nuch greater than the high frequency components of the input signal. This may not practical depending on the frequency of interest of the input signal. Finally, additional low-pass filter circuitry is required in switched capacitor circuits for aliasing.

There is a need for a high valued active device resistor for use in a low bandpass filter and other analog signal processing applications so that these analog signal processing applications can be implemented entirely on an IC chip.

SUMMARY OF THE INVENTION

A circuit and method provide a high valued resistance that is ideally used in low bandwidth filter and other signal processing applications. In one embodiment of the invention, an active device circuit includes first and second transistors, each having a gate, a source and a drain. The source voltages of the transistors change in response to an input signal voltage. on an input terminal, and a current source constrains the gate to source voltages across the first and second transistors thus producing an output signal at an output terminal connected to the gate of the second transistor having a desired output resistance value based on the resistance across the drain and source terminals of the second transistor.

BRIEF DESCRIPTION OF THE FIGURES

The invention is more fully described with reference to the accompanying figures and detailed description.

DETAILED DESCRIPTION OF THE INVENTION

Figure 3:
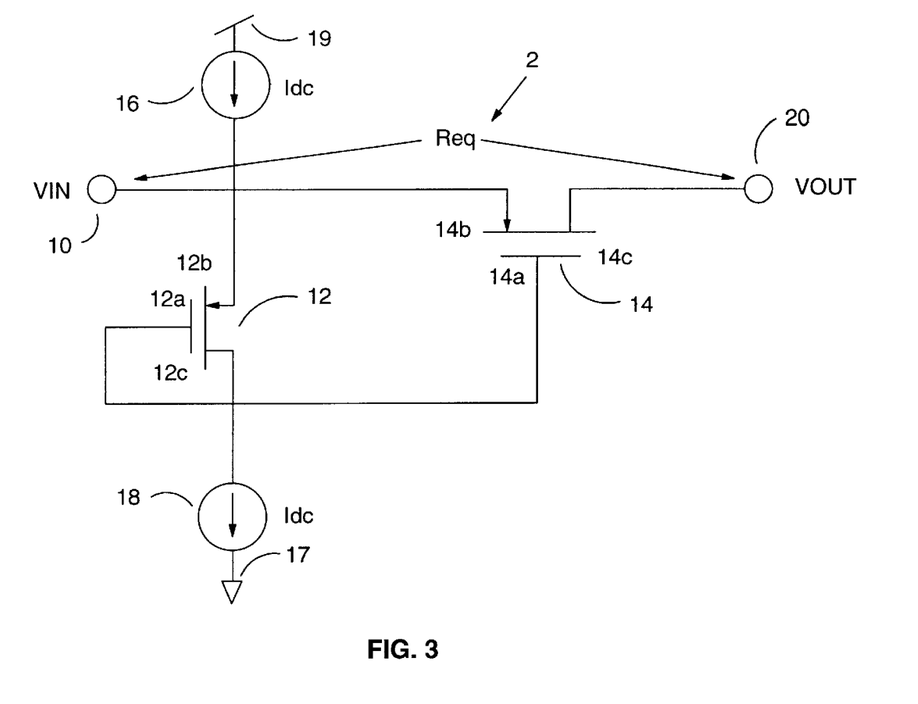
FIG. 3 depicts a first circuit for producing a high valued equivalent resistance across the source and drain of a transistor in accordance with the principles of the present invention.

FIG. 3 depicts a circuit 2 according to one embodiment of the invention. The circuit 2 has an input terminal 10, an output terminal 20, two p-type field effect transistors 12 and 14 and two controlled current supplies 16 and 18. The circuit 2 produces a high equivalent resistance between the input terminal and the output terminal across a transistor 14.

The transistors 12 and 14 of the circuit 2 depicted in FIG. 3 each have a gate (12a and 14a), a source (12b and 14b) and a drain (12c and 14c). The input terminal 10 is coupled to sources 12b and 14b of the transistors 12 and 14 respectively. The drain 12c and the gate 12a of transistor 12 are connected together and in turn are connected to the controlled current supply 18 and to the gate 14a of transistor 14. Another controlled current supply 16 is connected to the sources 12b and 14b of transistors 12 and 14 respectively.

In a preferred embodiment of the invention, the controlled current supplies 16 and 18 produce DC current in approximately the same quantity. The DC current and the parameters of the transistors 12 and 14 constrain operation of the circuit 2. These constraints are illustrated by the following equations:

Although the transistors 12 and 14 in FIG. 3 are shown as p-type transistors, the same function can be achieved by replacing transistors 12 and 14 with n-type transistors. With n-type transistors 12 and 14, the circuit is identical except that the position of the low and high voltage terminals 17 and 19 respectively are reversed. The controlled current supplies 16 and 18 are implemented either off of the IC chip or on the IC chip. Preferably, the controlled current supplies 16 and 18 are implemented on the IC chip using a well known band gap current supply.

Figure 4:
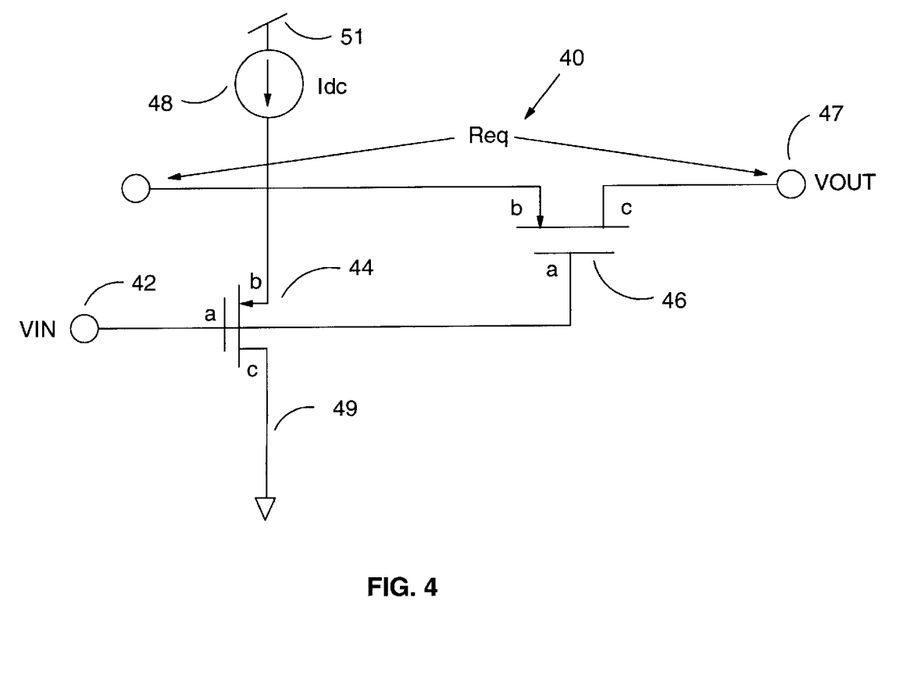
FIG. 4 depicts a second circuit for producing a high valued equivalent resistance across the source and drain of a transistor in accordance with the principles of the present invention.

FIG. 4 illustrates an alternate embodiment of the invention. Circuit 40 includes a controlled current supply 48 and two p-type transistors 44 and 46. Each transistor includes a gate, a source, and a drain designated respectively a, b, and c as indicated in FIG. 4. The controlled current source 48 is coupled to the sources 44b and 46b of transistors 44 and 46 respectively. The gates 44a and 46a of transistors 44 and 46 are coupled together and to an input voltage source 43. The output voltage terminal 47 is coupled to the drain 46c of transistor 46. The drain 44c of transistor 44 is coupled to a low voltage supply terminal.

The circuit 40 works on the same principals as the circuit 2 of FIG. 3. However, the output voltage of the circuit 40 is shifted up a voltage threshold ($V_T$) from the input signal voltage. The circuit 40 is more advantageously used than the circuit 2 when the input voltage 42 is produced by a high impedance source. When the circuit 2 of FIG. 3 is driven by MOSFET triode equation: $$I_{DS} = K' \frac{W}{L}\left((V_{GS} - V_T)V_{DS} - \frac{1}{2}V_{DS}^2\right)$$ Eq. 1

Overdrive Voltage: $$V_{OD} = V_{GS} - V_T$$ Eq. 2

Assumed operating position for transistor 14: $$V_{DS}(14) = 0$$ Eq. 3

Threshold matching between transistors 12 and 14: $$V_T(12) = V_T(14)$$ Eq. 4

Gate to source voltages equal: $$V_{GS}(12) = V_{GS}(14)$$ Eq. 5

Resistance Req: $$\frac{1}{R_{eq}} = \frac{\partial I_{DC}}{\partial V_{DS}} = K'\frac{W}{L}(V_{GS} - V_T - V_{DS})$$ Eq. 6

For transistor 14: $$\frac{1}{R_{eq}} = \frac{\partial I_{DC}(14)}{\partial V_{DS}(14)} = K'\frac{W(14)}{L(14)}(V_{GS}(14) - V_T(14) - V_{DS}(14))$$ Eq. 7

Substitute Eq. 3, 4, 5, into Eq.7: $$\frac{1}{R_{eq}} = K'\frac{W(14)}{L(14)}(V_{GS}(12) - V_T(12))$$ Eq. 8

Substitute Eq. 2 into Eq. 8 and invert: $$R_{eq} = \frac{1}{K'\frac{W(14)}{L(14)}VOD(12)}$$ Eq. 9

Equation 9 above shows that the equivalent resistance Req across the drain 14c to source 14b of transistor 14 is a function of the overdrive voltage (VOD) of the transistor 12. VOD is determined by the DC current chosen for the supplies 16 and 18 and by the values K', and the width ("W") and length ("L") of transistor 12. Therefore, values may be chosen to select an appropriate resistance Req given a particular signal processing application. Resistances larger than 1 mega ohm can be achieved for Req using this circuit topology. This is approximately 100 times greater than passive resistance values practically achievable on integrated circuit ("IC") chips. Conversely, Req can be designed to be quite low if desired by designing the transistor 14 with a large value of W, a small value of L, and by increasing the current supplied by the supplies 16 and 18.

a high impedance source, any mismatch between the controlled current supplies 16 and 18 can affect the voltage level of the input signal and render the active resistor circuit 2 less effective. This does not occur in the circuit 40 of FIG. 4 where the input signal 42 arrives at the high impedance gates 44a and 46a of transistors 44 and 46 respectively.

In the embodiment of FIG. 4, the transistors are p-type field effect transistors. The body of each p-type transistor may be tied to the same potential as the sources 44a and 46a or preferably the bodies are tied to the high voltage supply terminal 51. In an alternate embodiment, the transistors are n-type transistors with the drain 44c of transistor 44 being tied to the high voltage supply terminal 51 instead of the low voltage supply terminal 49 as shown in FIG. 4. The body of the n-type transistors is typically tied to the low voltage supply terminal.

Figure 5:
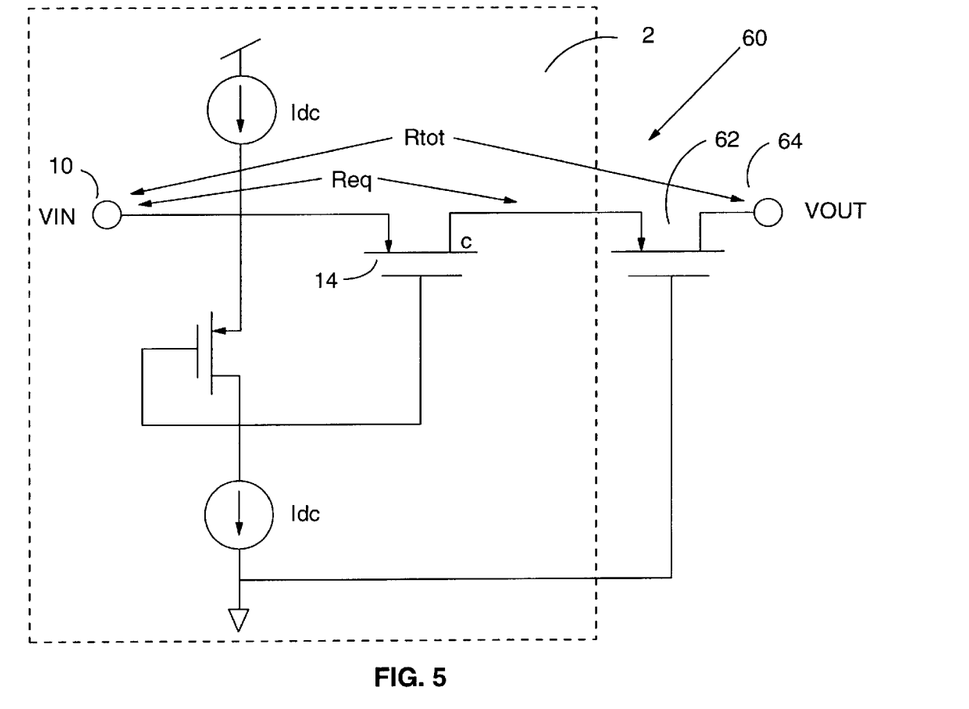
FIG. 5 depicts the circuit of FIG. 3 including a third transistor for improving the total resistance of the circuit at high frequencies.

FIG. 5 illustrates still another embodiment according to the present invention. The circuit 60 depicted is the same as the circuit 2 of FIG. 3 with the addition of a third p-type transistor 62. The transistor 62 has its source 62b coupled to the drain 14c of transistor 14. The gate 62a is coupled to the low voltage supply terminal, and the drain 62c coupled to the output terminal 64. The Transistor 62 is biased in the "on" position by the connection of the gate 62a to the ground terminal. The transistor 62 greatly enhances the total resistance between the input terminal 10 and the output terminal 64 at high frequencies, when the drain 14c and the source 14b of transistor 14 begin to short out lowering Req.

Figure 6:
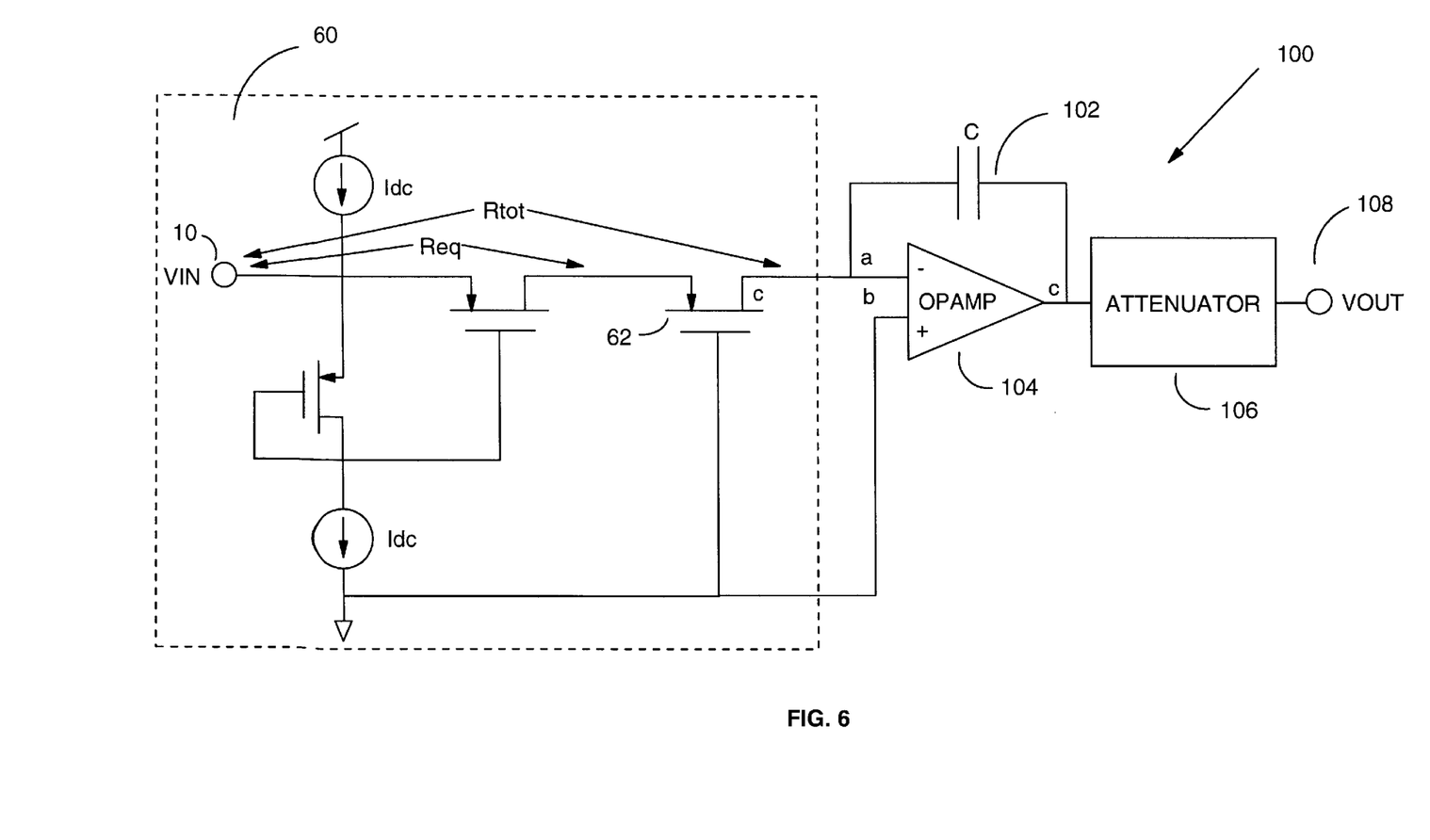
FIG. 6 depicts the resistive circuit of FIG. 5 forming the front end of a low bandpass filter.

FIG. 6 illustrates the circuit 60 implemented as a front end to a low-pass filter 100. The low pass filter 100 includes the active resistance circuit 60, a capacitor 102, an operational amplifier 104, and an attenuator 106. The capacitor 102 is connected at one end to the drain 62c of transistor 62 and to the negative input 104a of the operational amplifier 104. At the other end, the capacitor is connected to the output 104c of the operational amplifier 104 and to the input of the attenuator 106. The operational amplifier 104 is connected at its positive terminal 104b to a low voltage supply terminal and at its output terminal 104c to the input of the attenuator 106. The output of the attenuator 106 is connected to an output terminal 108.

In a preferred embodiment of the invention, the low pass filter 100 is implemented on an integrated circuit and the circuit 60 is designed to present a high value of resistance (approximately 1 Mega ohm) between the input terminal 10 and the negative input terminal 104a of the operational amplifier. This enables the implementation of a capacitor 102 in the low pass filter 100 that is on the IC chip itself with a value in the range of 15 to 150 pF and will produce a low frequency pole suitable for a low-pass filter applications. The circuit 60, the capacitor 102, and the operational amplifier 104 cooperate in an integrator configuration to create the low-pass filter 100. The attenuator 106 is used to reduce the gain of the low-pass filter 100 to a desirable value.

Figure 7:
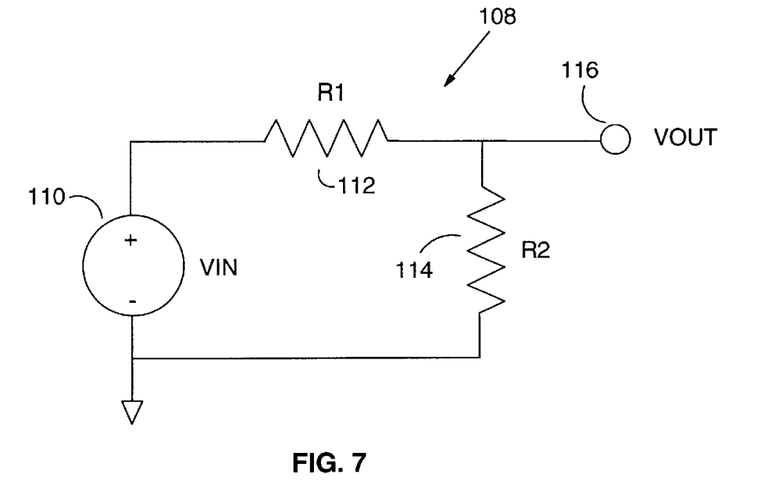
FIG. 7 illustrates an attenuator circuit of the prior art.
Figure 8:
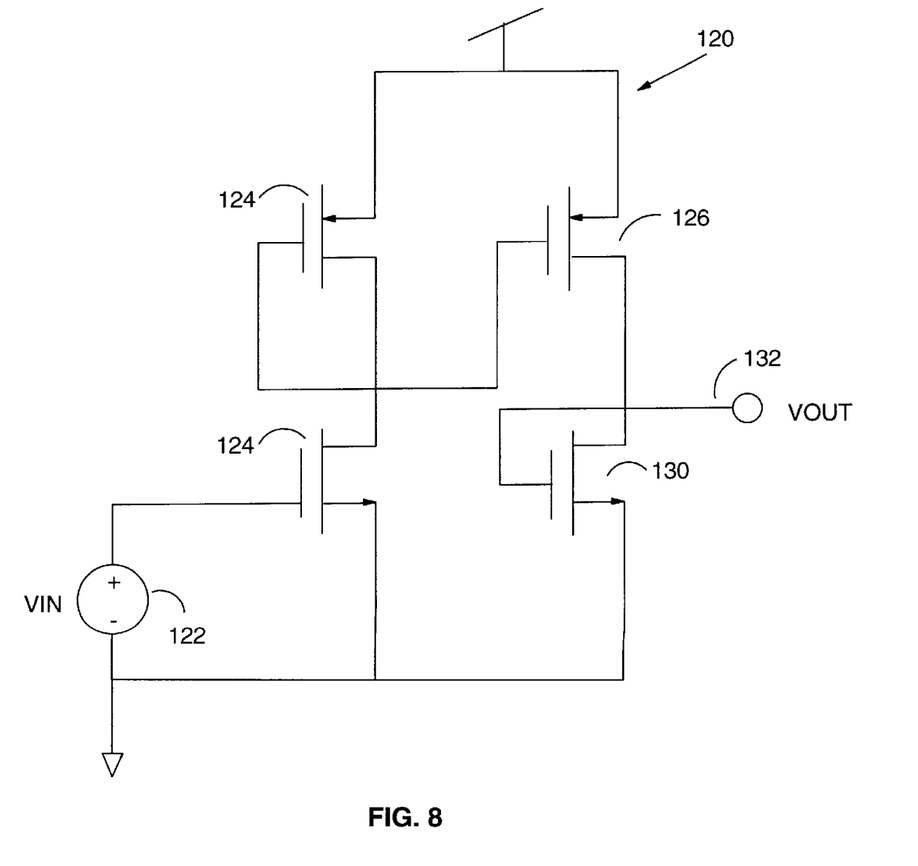
FIG. 8 shows another attenuator circuit of the prior art.

FIGS. 7 and 8 illustrate embodiments of an attenuator. In the circuit 108 of FIG. 7, an input signal 110 is connected to one end of a resistor 112. The resistor 112 is connected at the other end to a resistor 114 and an output voltage terminal 116. Attenuation ("A") of the input signal 110 is determined by:

$$A = \frac{R_{112}}{(R_{110} + R_{112})}$$

The circuit 120 of FIG. 8 includes two n-type transistors 128 and 130 and two p-type transistors 124 and 126 arranged to produce signal attenuation between the input signal 122 and the output voltage terminal 132. The sources of transistors 124 and 126 are each connected to the high voltage terminal. The gate and drain of transistor 124 are connected together and to the gate of transistor 126. Transistor 128 has its drain connected to the drain of transistor 124, its gate connected to the input signal voltage 122, and its source connected to a low voltage supply terminal. The transistor 130 has its drain and gate connected together and to the drain of transistor 126 and to the output voltage terminal 132. The source of transistor 170 is connected to the low voltage supply terminal. The circuit 120 produces a signal attenuation between the input voltage signal 122 and the output voltage signal of:

$$A = \frac{gm128 * gm126}{gm130 * gm124}$$

Figure 9:
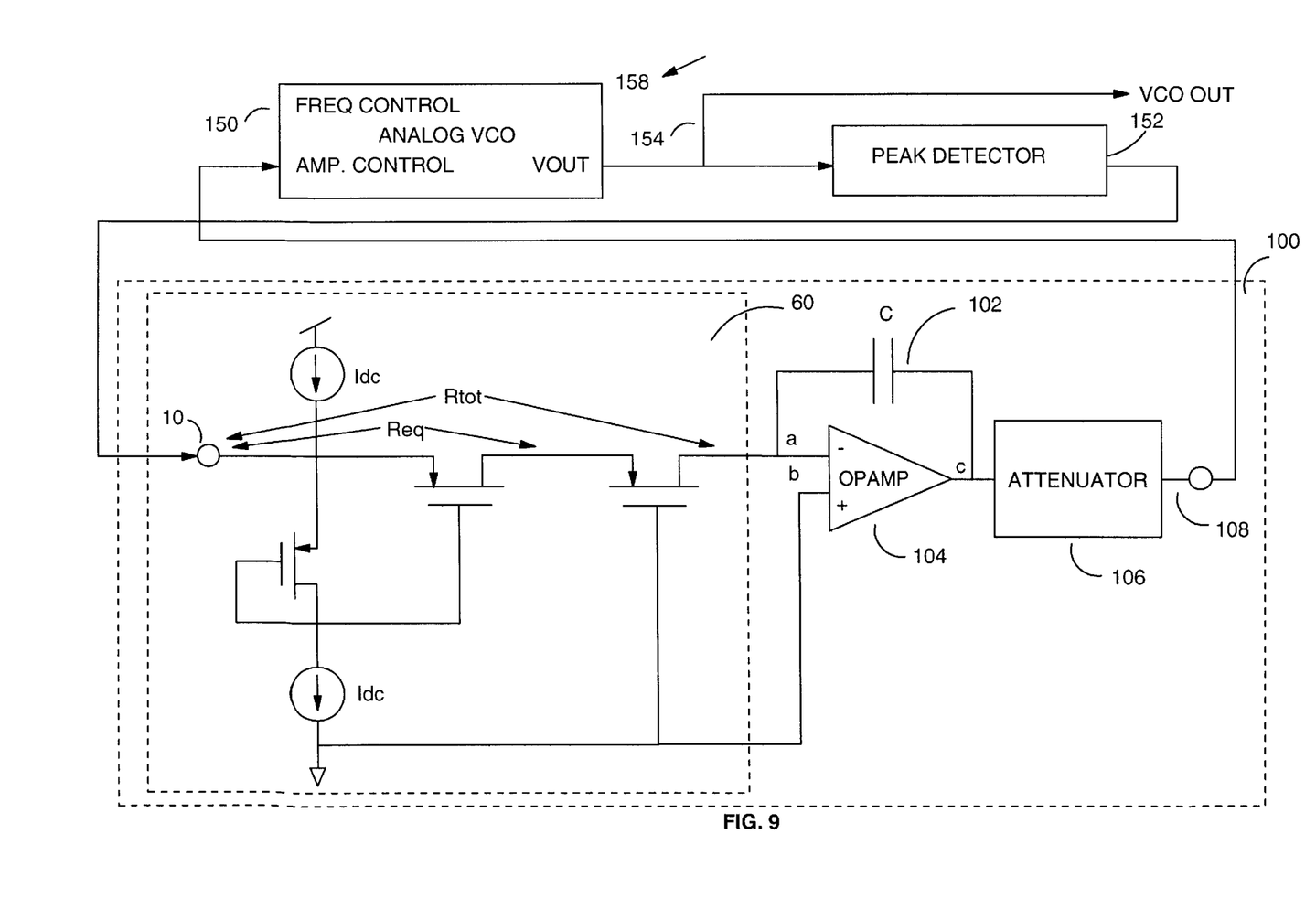
FIG. 9 shows a voltage controlled oscillator (VCO) that includes an active device resistor of FIGS. 3, 4, or 5 according to the present invention.

In another embodiment of the invention shown in FIG. 9, a low pass filter 100 that includes the active resistor circuit 60 is used to filter an amplitude control input to an analog voltage controlled oscillator 150. The output 108 of the low pass filter 100 is coupled to an amplitude control input of the analog VCO 150. A frequency control signal is coupled to another input of the analog VCO 150. An output of the analog VCO 150 is coupled to an input of a peak detector 152. The output of the analog VCO 150 is also the VCO output of the VCO circuit 158. The output of the peak detector is coupled to the input 10 of the low pass filter circuit 100. The attenuator 106 of the low pass filter 100 is used to adjust the loop gain of the VCO circuit 158.

Figure 10:
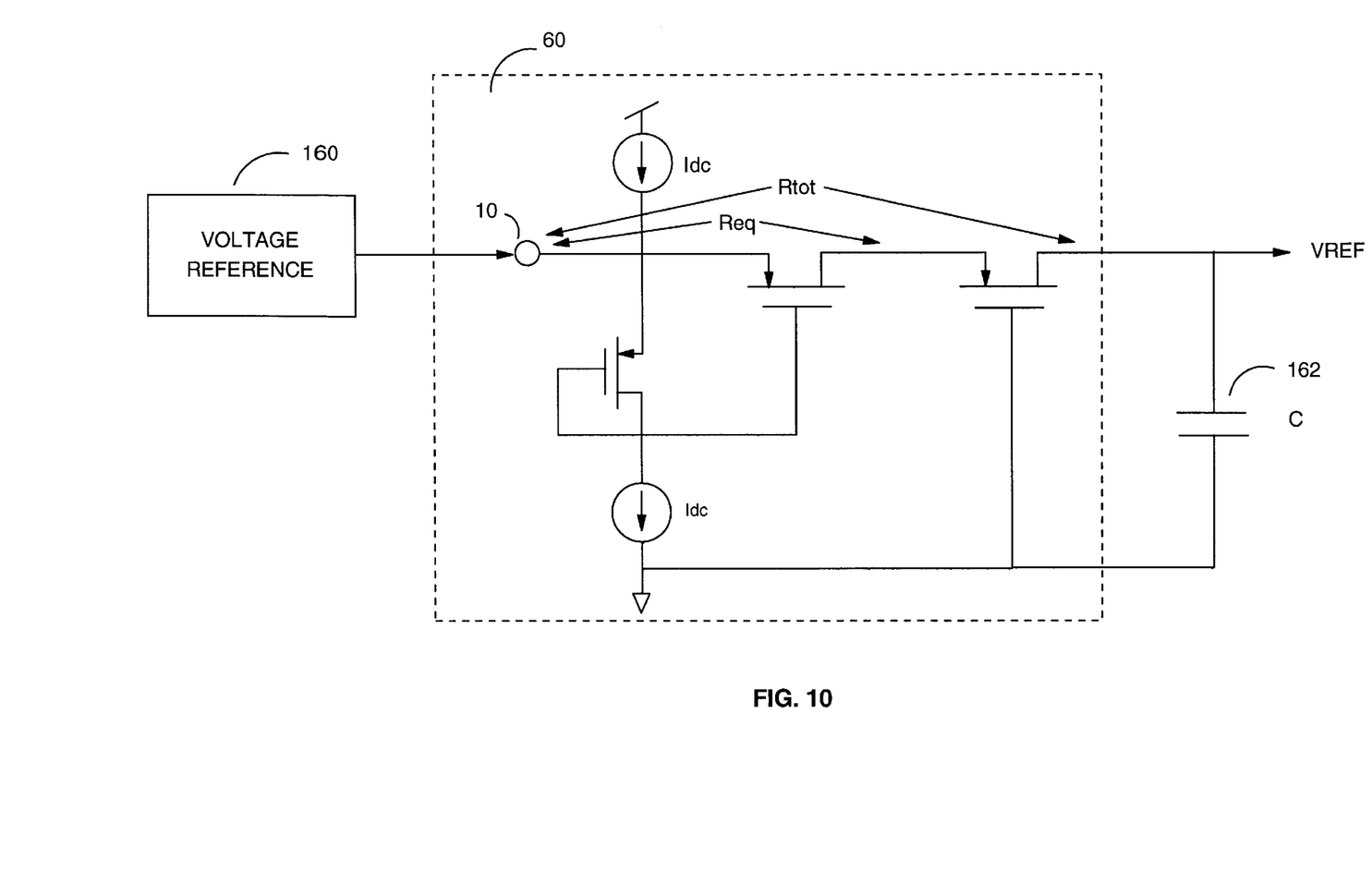
FIG. 10 shows an embodiment of an active device resistor that includes an output capacitor for filtering the output of the voltage reference.
Figure 11:
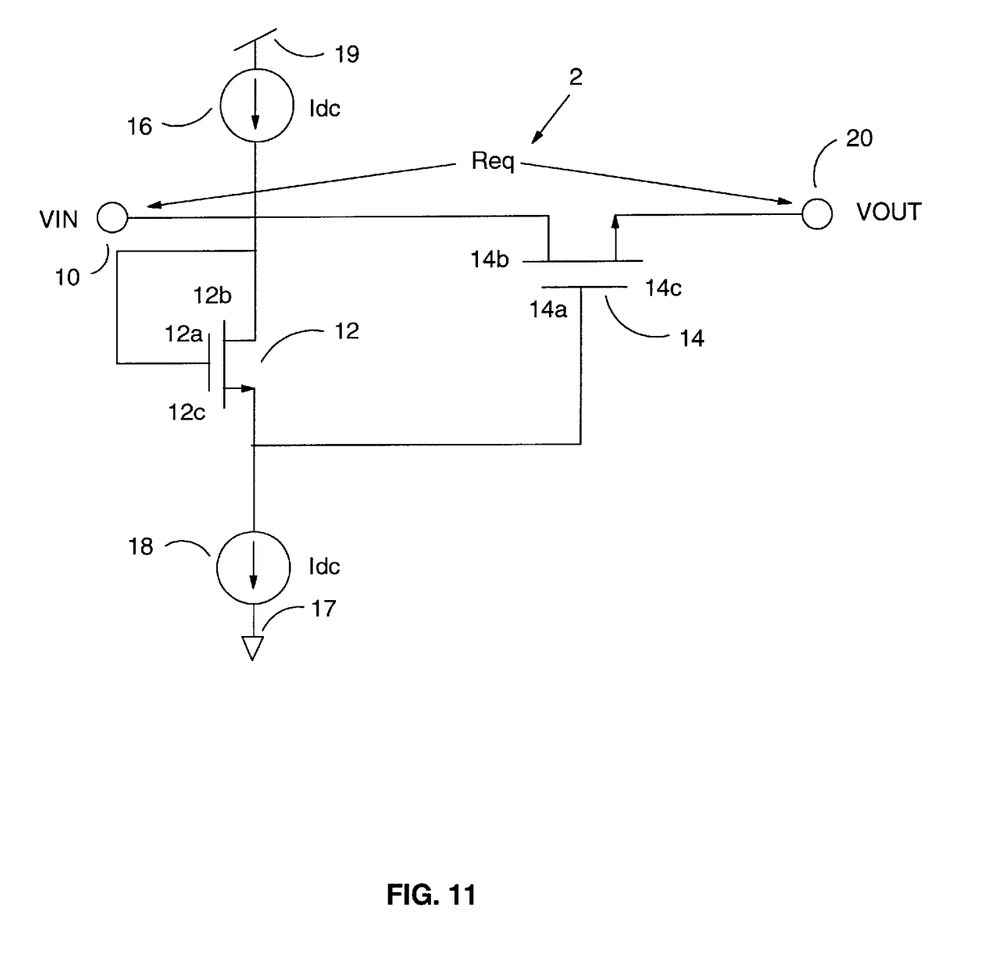
FIG. 11 illustrates another embodiment according to the present invention using NFET.

The active device resistor embodiments 2, 40, and 60 may be used in a variety of signal processing applications. For example, as shown in FIG. 10, with a capacitance 162 connected between the output terminal and the low voltage supply terminal a simple low-pass filter is formed. This embodiment may be used to filter high frequency noise from, for example, a voltage reference 160 coupled to the input terminal 10 of the active device resistor circuit embodiment 60 as shown in FIG. 10. FIG. 11 illustrates an NFET implementation of a filter.

Although specific embodiments of the invention have been described, it will be understood by those having ordinary skill in the art that changes may be made to those embodiments without departing from the spirit and scope of the invention.

I claim:

1. A circuit for producing a resistance between an input terminal and an output terminal, comprising:

first and second transistors, each having a gate, a source and a drain, the sources being connectable to a controlled current supply and the drain of the first transistor being coupled to a voltage supply terminal;

the input terminal, connected to the first and the second transistor; and the output terminal connected to the drain of the second transistor;

wherein the gate and source of the first transistor are respectively connected to the gate and source of the second transistor, a first voltage of the sources changes in response to an input signal voltage on the input terminal, and the current supply constrains a second voltage across the gate and the source of each of the first and second transistors producing an output signal at the output terminal having a desired output resistance value based on the resistance across the drain and source terminals of the second transistor.

2. The circuit according to claim 1, wherein the circuit resides on an integrated circuit.

3. The circuit according to claim 2, wherein the controlled current supply is connected to the sources of the transistors and the controlled current supply resides on the integrated circuit.

4. The circuit according to claim 1, wherein the first and second transistors are p-type field effect transistors.

5. The circuit according to claim 1, wherein the first and second transistors are n-type field effect transistors.

6. The circuit according to claim 2, wherein the input terminal is connected to the source of the first transistor.

7. The circuit according to claim 6, wherein the drain of the first transistor is connectable to a second controlled current supply that approximately matches the controlled current supply.

8. The circuit according to claim 7, wherein the controlled current supply and the second controlled current supply are connected to the first transistor and the current supply and the second current supply reside on the integrated circuit.

9. The circuit according to claim 2, wherein the input terminal is connected to the gate of the first transistor.

10. The circuit according to claim 1, wherein the controlled current supply is connected to the source of the first transistor and the controlled current supply resides on the integrated circuit.

11. The circuit according to claim 1, further comprising a third transistor having:
    a gate coupled to the voltage supply terminal;
    a source coupled to the drain of the second transistor; and
    a drain;
    wherein the output terminal is connected to the drain of the third transistor instead of the drain of the second transistor.

12. The circuit according to claim 11, wherein the circuit resides within a low pass filter.

13. The circuit according to claim 12, wherein input signals to the low pass filter enter the input terminal of the circuit and wherein the output terminal of the circuit is coupled to a capacitor and an operational amplifier in an integrator configuration.

14. The circuit according to claim 1, wherein the circuit resides within a low pass filter.

15. The circuit according to claim 14, wherein input signals to the low pass filter enter the input terminal of the circuit and wherein the output terminal of the circuit is coupled to a capacitor and an operational amplifier in an integrator configuration.

16. A method for producing a resistance between an input terminal and an output terminal, comprising the steps of:
    connecting a gate and a source of a first transistor respectively to a gate and a source of a second transistor;
    connecting a controlled current supply to the sources;
    coupling a drain of the first transistor to a voltage supply terminal; and
    connecting the input terminal to the first and second transistors and the output terminal to a drain of the second transistor;
    wherein the controlled current supply constrains a voltage between the gate and the source of the first and second transistors producing a desired resistance value between the source of the second transistor and the output terminal.

17. The method according to claim 16, further comprising the step of:
    connecting a second controlled current supply to a drain of the first transistor.

18. The method according to claim 16, further comprising the step of connecting the input terminal to the gate of the first and second transistors.

19. The method according to claim 16, further comprising the step of:
    connecting a gate of a third transistor to the voltage supply terminal, a source of the third transistor to the drain of the second transistor, and moving the output terminal to a drain of the third transistor.

20. The method according to claim 16, wherein the output terminal is coupled to a capacitor of a low bandpass filter.

* * * * *